(12) United States Patent
Bunce et al.

(10) Patent No.: US 9,070,433 B1
(45) Date of Patent: Jun. 30, 2015

(54) SRAM SUPPLY VOLTAGE GLOBAL BITLINE PRECHARGE PULSE

(71) Applicant: International Business Machines Corporation, Armonk, NY (US)

(72) Inventors: Paul A. Bunce, Poughkeepsie, NY (US); Yuen H. Chan, Poughkeepsie, NY (US); John D. Davis, Maybrook, NY (US); Diana M. Henderson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/203,790

(22) Filed: Mar. 11, 2014

(51) Int. Cl.
*G11C 7/00* (2006.01)
*G11C 5/14* (2006.01)
*G11C 11/419* (2006.01)

(52) U.S. Cl.
CPC .............. *G11C 5/147* (2013.01); *G11C 11/419* (2013.01)

(58) Field of Classification Search
CPC ......... G11C 7/12; G11C 11/4094; G11C 7/22
USPC .................... 365/203, 189.05, 194
See application file for complete search history.

(56) References Cited

U.S. PATENT DOCUMENTS

| | | | |
|---|---|---|---|
| 6,088,291 A * | 7/2000 | Fujioka et al. | 365/233.14 |
| 6,185,149 B1 * | 2/2001 | Fujioka et al. | 365/233.18 |
| 6,452,851 B1 * | 9/2002 | Endo et al. | 365/205 |
| 6,657,908 B2 | 12/2003 | Yoon et al. | |
| 7,248,517 B2 | 7/2007 | Lee et al. | |
| 7,272,030 B2 | 9/2007 | Chan et al. | |
| 7,668,037 B2 | 2/2010 | Carpenter et al. | |
| 7,876,600 B2 | 1/2011 | Zhang et al. | |
| 7,876,631 B2 | 1/2011 | Chai et al. | |
| 7,952,939 B2 | 5/2011 | Chen et al. | |
| 8,139,426 B2 | 3/2012 | Park et al. | |
| 8,416,633 B2 | 4/2013 | Zampaglione et al. | |
| 2010/0039872 A1 | 2/2010 | Park et al. | |
| 2010/0085823 A1 | 4/2010 | Carpenter et al. | |
| 2010/0148839 A1 | 6/2010 | Chai et al. | |
| 2010/0165754 A1 | 7/2010 | Gupta et al. | |

FOREIGN PATENT DOCUMENTS

KR          100239885 B1     1/2000

* cited by examiner

*Primary Examiner* — Son Dinh
(74) *Attorney, Agent, or Firm* — Cantor Colburn LLP; Margaret McNamara (57) ABSTRACT

A technique to generate timing control for an SRAM circuit operating with dual power supplies is provided. A voltage signal is generated by a programmable local clock buffer that receives power from a first voltage level. The voltage signal is shifted higher by a level shifter that receives power from both the first voltage level and a second voltage level. The voltage signal is delayed by a delay clock chopper circuit that receives power from the second voltage level. The delay clock chopper circuit includes a programmable pulse width variation (PWVAR) circuit that varies the pulse width of the voltage signal. The PWVAR circuit receives power from the second voltage level. The voltage signal drives a global bitline of the SRAM. The voltage signal has timing sensitive to both the first and second voltage levels. The voltage signal has its pulse width sensitive to the second voltage level.

20 Claims, 9 Drawing Sheets

SRAM SUPPLY VOLTAGE GLOBAL BITLINE PRECHARGE PULSE

BACKGROUND

The present invention relates to memory circuits, and more specifically, to supply voltages for the global bitline precharge pulse.

To address the tradeoff between performance and power consumption, multiple operating voltage domains ("voltage domains") are increasingly being provided in circuits. Circuit paths are provided which pass through the multiple voltage domains to provide different operating voltages to different components of a circuit. Providing multiple voltage domains allows a lower voltage domain to provide power to components that do not require minimum voltage levels to conserve power. Components that either have a minimum operating voltage level for proper operation or provide critical paths where performance cannot be sacrificed may be powered by the higher voltage domain. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

Examples of circuits where multiple voltage domains are commonly employed are memory circuits and memory systems. One example is static random access memory (SRAM). SRAM may be used on cache memory. SRAM cells have a minimum operating voltage level to retain stability and properly retain data.

SUMMARY

According to one embodiment, a method is provided to generate timing control for an SRAM circuit operating with dual power supplies. The method includes generating a voltage signal by a programmable local clock buffer that receives power from a first voltage level, shifting the voltage signal higher by a level shifter that receives power from both the first voltage level and a second voltage level, and delaying the voltage signal by a delay clock chopper circuit that receives power from the second voltage level. The delay clock chopper circuit includes a programmable pulse width variation circuit. The method includes varying a pulse width of the voltage signal by the programmable pulse width variation circuit that receives power from the second voltage level, and driving a global bitline of the SRAM circuit with the voltage signal. The voltage signal has timing that is sensitive to both the first voltage level and the second voltage level and a pulse width that is sensitive to the second voltage level.

According to one embodiment, a precharge generation circuit is provided to generate timing control for an SRAM circuit operating with dual power supplies. The circuit includes a programmable local clock buffer configured to generate a voltage signal and to receive power from a first voltage level, and a level shifter connected to the programmable local clock buffer. The level shifter is configured to shift the voltage signal higher and to receive power from both the first voltage level and a second voltage level. A delay clock chopper circuit is connected to the level shifter. The delay clock chopper circuit is configured to delay the voltage signal and to receive power from the second voltage level. The delay clock chopper circuit includes a programmable pulse width variation circuit. The programmable pulse width variation circuit is configured to vary a pulse width of the voltage signal and to receive power from the second voltage level. A global bitline of the SRAM circuit is driven with the voltage signal. The voltage signal has timing sensitive to both the first voltage level and the second voltage level and the pulse width sensitive to the second voltage level.

Additional features and advantages are realized through the techniques of the embodiments of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As technology improvements diminish with each generation, memory macros, such as SRAM arrays, have begun to use a separate power supply from the logic circuitry in order to meet performance requirements. These memory macros (SRAM arrays) must provide level shifting of input address/control signals and array output to meet the logic voltage level. The output level shifting to the logic level power supply is typically done at the global bitline where the pull down (e.g., pull down to ground or 0 volts) is controlled by an evaluation signal on the SRAM power supply (Vcs) and the precharge is controlled by a precharge signal on the logic power supply (Vdd). As the process and power supply levels vary, the timing of the Vdd level precharge and the Vcs level evaluate begin to overlap causing the precharge (gate voltage signal to a p-type field-effect transistor (PFET)) and evaluation (gate voltage signal to an n-type field-effect transistor (NFET)) to be active at the same time. This leads to extra power consumption and can result in functional failures.

In order to provide better tracking, a precharge pulse with delay and pulse width dependent on the Vcs supply is provided according to an embodiment. In the example macro, the global bitline is reset in the beginning of a cycle where the memory array will be accessed.

Figure 1:
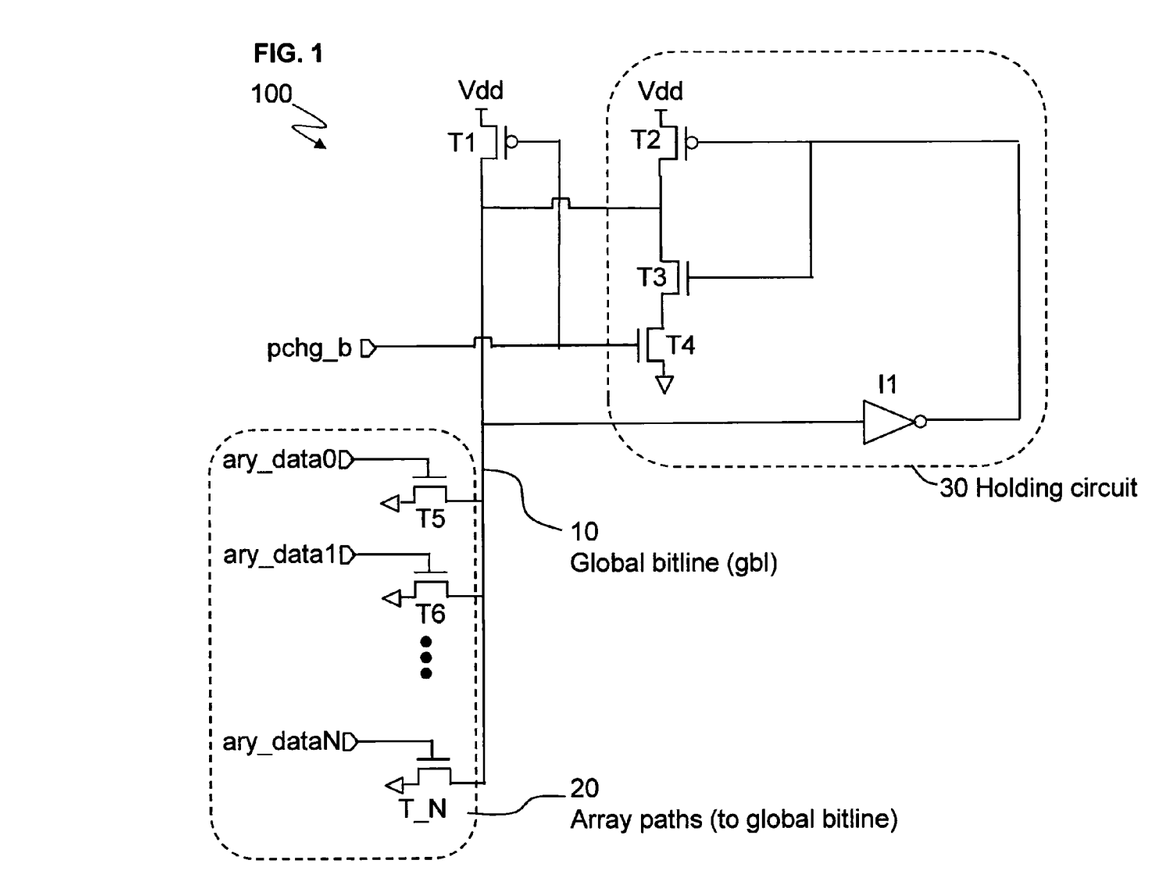
FIG. 1 illustrates a circuit with a global bitline that connects to an SRAM circuit according to an embodiment.

Turning to the figures, FIG. 1 illustrates a circuit 100 with a global bitline (gbl) 10 that connects to an SRAM circuit (not shown) according to an embodiment.

The circuit 100 includes a power transistor T1 that provides voltage Vdd to the global bitline 10 when the transistor T1 is turned on (via gate voltage) by precharge_b voltage (pchg_b). The transistor T1 is turned on when the precharge_b is low (voltage) and turned off when the precharge_b is high. When turned on by the precharge_b, the transistor T1 pulls the global bitline 10 up to the voltage Vdd.

The circuit 100 includes array paths 20 connected to transistors T5 through T_N. The array paths 20 represent paths to the SRAM (such as a cache). Assume that array_data 0 (ary_data 0) is high and the array_data 0 is provided to the gate terminal of transistor T5 in order to turn on the transistor T5. When transistor T5 is turned on, the transistor T5 pulls the global bitline 10 down to ground (e.g., approximately or near 0 volts). Array_data 0 (ary_data 0) for transistor T5 is utilized for example purposes, but the description applies by analogy to array_data 1 through N (ary_data 1 through ary_data N) that respectively supply gate voltage for transistors T6 through T_N (which is the last transistor).

A holding circuit 30 holds the value of the global bitline 10. The holding circuit 30 includes transistors T2, T3, and T4, and an inverter I1.

A state-of-the-art technique is now discussed. In the state-of-the-art system, the precharge_b signal is designed using circuits powered with the voltage Vdd, while the array_data 0 signal is designed using circuits powered with both the voltage Vdd and the voltage Vcs. As such, the timing and pulse width of the precharge_b signal are only sensitive to (i.e., dependent upon) the Vdd voltage level. As discussed herein, sensitive to means dependent upon. The array_data 0 path has timing and pulse width sensitive to (dependent upon) both Vdd and Vcs voltage levels. For example, the SRAM circuit may have dual supply voltage Vdd and Vcs. Vdd is the logic supply, and Vcs is the SRAM supply. The SRAM supply (Vcs) is for decode and memory cell access in the SRAM circuit. Normally, Vcs is higher than Vdd. The array_data (which applies to any array_data signal) is sent as part of the evaluation for the SRAM. The precharge alignment (i.e., timing) and pulse width is only based on Vdd in the state-of-the-art system. For example, with the state-of-the art precharge pulse being based entirely on the Vdd supply and with the SRAM having Vcs level sensitivity for the evaluate (array_data in the state-of-the system), as the Vdd and Vcs voltages vary (through supply tolerances, on chip voltage drops, or intentional supply settings) the alignment of the precharge pulse and the array evaluate will (improperly) change. One issue is if the Vdd supply were lower than the design specifications for the Vdd voltage, this would make the precharge pulse slower and wider than at the designed specifications. As such, the Vdd pulse could overlap the array evaluate pulse (front end timing problem). Conversely, if Vdd were higher (e.g., in magnitude) than the design specifications, the precharge pulse would speed up and be narrower than at the designed specifications. This would affect the frequency at which the array could be run since the next precharge pulse should not start until after the array evaluate pulse has finished (back end timing problem).

However, in embodiments, the global bitline precharge_b signal is to be sent before the memory evaluate (e.g., ary_data 0 signal). Embodiments are configured to address overlapping global precharge (i.e., the precharge_b voltage) and memory evaluate (i.e., the array_data 0). The overlap of sending the precharge_b and array_data 0 turn on both transistors T1 and T5, if the pulse for precharge_b is falling while the pulse for array_data 0 is rising. During this overlap (of being both turned on), transistor T1 attempts to pull the global bitline 10 up to Vdd as the transistor T5 attempts to pull the global bitline 10 down to ground. The overlap (both transistors T1 and T5 being turned on) of the precharge_b and the array_data 0 signals can cause power burn, impact access time to the memory circuits/cells of the SRAM, and cause functional issues.

Embodiments are configured so that precharge (i.e., the precharge_b signal) occurs before evaluate (i.e., the array_data 0 signal). This causes precharge_b to rise before the evaluate (i.e., array_data 0) rises, and precharge_b falls after the evaluate falls.

Figure 2:
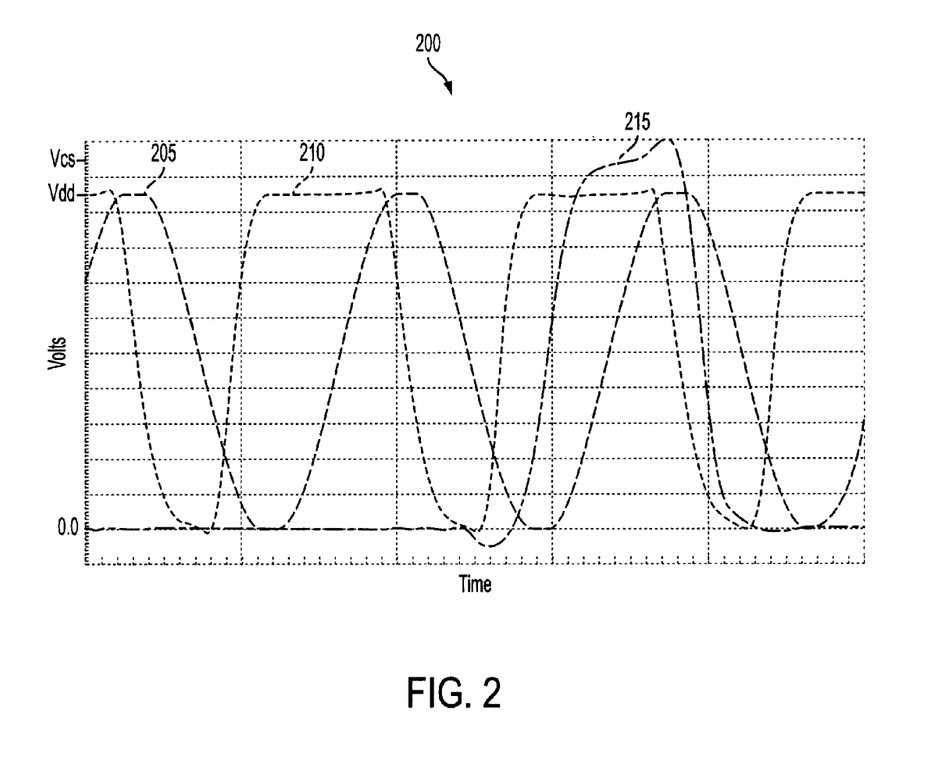
FIG. 2 illustrates a graph of global precharge timing according to an embodiment.

FIG. 2 illustrates a graph 200 of global precharge timing according to an embodiment. The graph 200 includes a curve 205 for the grid clock, a curve 210 for precharge (i.e., precharge_b) and a curve 215 for evaluate (which represents, e.g., ary_data 0 but can be any one of array_data 0 through N). FIG. 2 illustrates the precharge pulse 210 and the array evaluate 215 alignment issue. The first falling grid clock (205) synchronizes the precharge pulse and the array evaluate pulse. The negative active precharge pulse 210 must fall and rise before the array evaluate rises (as shown in this FIG. 2). Since the next falling edge of the grid clock 205 will synchronize the precharge and evaluate for the next cycle, the falling edge of the array evaluate 215 should occur before the next falling precharge pulse 210. As shown here, the operating frequency is too high and the next precharge pulse 210 is falling before the array evaluate 215 falls.

Embodiments are configured to create a global bitline precharge pulse with Vdd and Vcs sensitivity. The precharge_b (pulse) has leading and trailing edges with Vcs level sensitivity, improved tracking with the memory access over wide range of PVT (process, voltage, temperature), and eliminates evaluate/precharge overlap at the global bitline 10. Embodiments provide power savings and higher frequency operation. Note that in designing the circuitry which creates the precharge_b pulse, components with Vdd level power and Vcs level power are used. Thus, if Vdd and/or Vcs vary from the specified nominal value, the pulse alignment and width vary in concert to maintain proper alignment in embodiments (as opposed to the state-of-the art system in which the pulse alignment and width would vary separately when the Vdd and/or Vcs are out of the specified nominal value).

Figure 3:
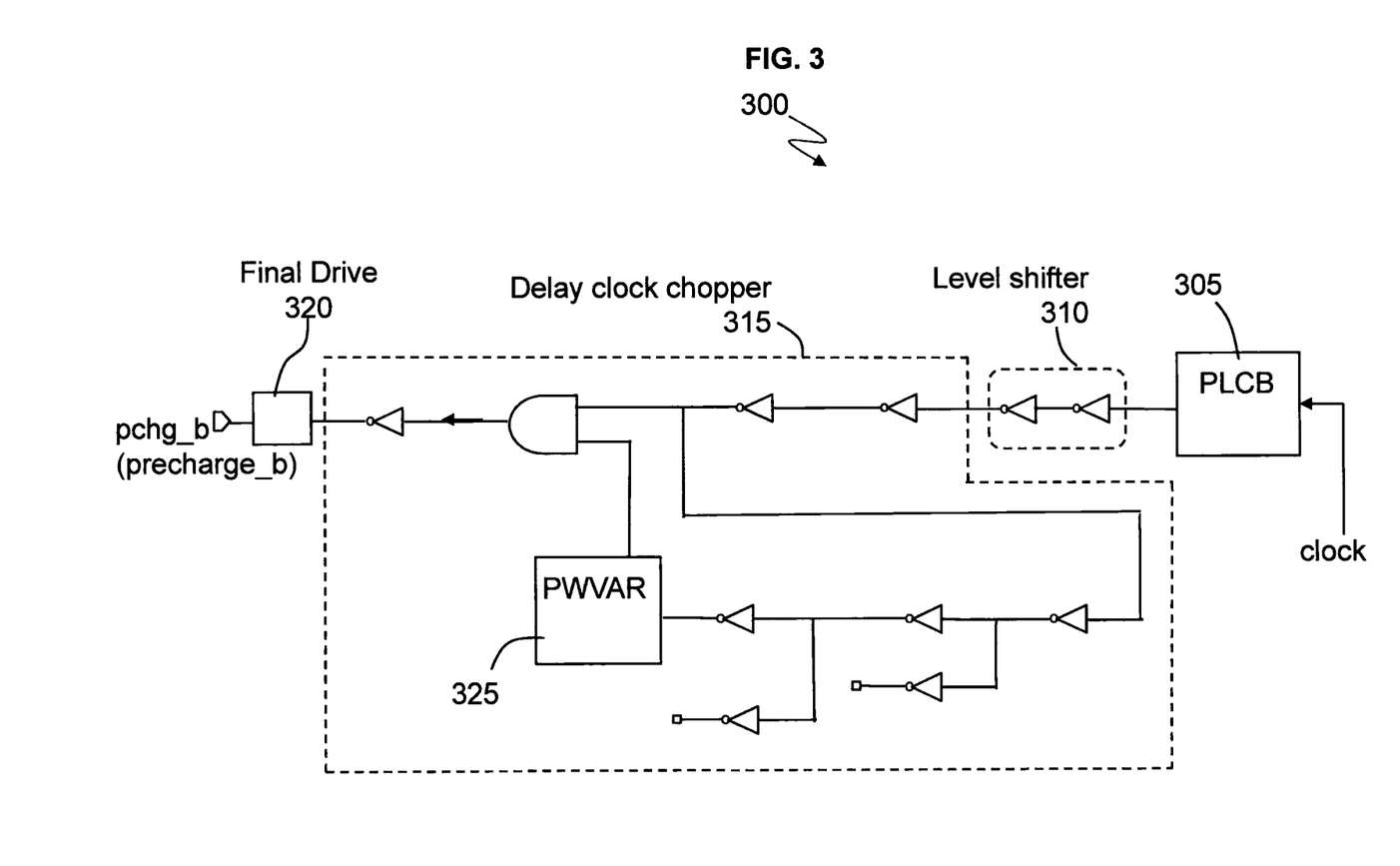
FIG. 3 illustrates a precharge pulse generation circuit for integrating both SRAM power supply (Vcs) and logic power supply (Vdd) sensitivity according to an embodiment.

FIG. 3 illustrates a precharge pulse (pchg_b) generation circuit 300 for integrating both Vcs and Vdd voltage sensitivity according to an embodiment. The circuit generates the precharge_b (shown in FIG. 1) with a sensitivity to voltage Vcs such that the precharge_b signal and the array_data 0 signal do not overlap, which then allows transistor T1 and transistor T5 to not be turned on at the same time. That is the precharge_b signal is not low (i.e., turning on transistor T1) when the array_data 0 signal is high (turning on transistor T5).

The circuit 300 includes a programmable local clock buffer (PLCB) 305 that receives a clock signal. This clock signal to the PLCB 305 may or may not be delayed from the grid clock (grid_clk). In one case, the clock signal input to the PLCB 305 is the grid clock (grid_clk). The grid clock is the external clock which synchronizes the logic and memory on the chip. Delay may be inserted between the grid clock and a given element creating a delayed grid clock. The PLCB 305 creates a signal based on the Vdd level, which means the signal has the timing and pulse width that depends on the level of the voltage Vdd. The PLCB 305 outputs to a level shifter 310. The level shifter 310 shifts or increases the magnitude of the voltage up from Vdd to Vcs. The level shifter 310 is output to a delay clock chopper circuit 315 that is powered from the Vcs voltage. The added delay of the delay clock chopper circuit 315 is intended to have similar timing/delay as the array path 20 (e.g., the timing and delay clock chopper circuit 315 mimics the timing and delay in the array path 20, thus adding Vcs sensitivity). The timing/delay of the array path 20 is the time required to generate and transmit the ary_data 0 signal (i.e., memory evaluate signal) through the data path 20. The delay clock chopper circuit 315 also sets the pulse width of the precharge_b pulse using Vcs level elements (fixed and programmable delay.) Note that the PLCB 305 is set to non-pulse mode so that the pulse width is determined by the delay clock chopper circuit 315. The delay clock chopper circuit 315 outputs (to a final drive circuit 320) a global_reset pulse (gbl_rst) that has (both) timing and pulse width sensitive to (dependent upon both) Vdd (from the PLCB 305 and final drive 320) and Vcs (from the delay clock chopper 315.) The final drive circuit 320 converts the magnitude of the voltage signal from Vcs to Vdd, and outputs the precharge_b (pchg_b) voltage. The precharge_b voltage has a pulse width that varies with Vcs (e.g., the pulse width of precharge_b voltage increases as the voltage level Vcs decreases and the pulse width of precharge_b voltage decreases as the voltage level Vcs increases). The precharge_b voltage has a delay that is sensitive to the Vcs and Vdd voltage levels.

The delay clock chopper circuit 315 includes inverters, a pulse width variation (PWVAR) circuit 325, and an AND gate. The PWVAR circuit 325 may be programmed to vary (either wider or narrower) the pulse width of the precharge_b signal and is also powered from the Vcs voltage to maintain Vcs pulse width sensitivity (i.e., the pulse width of precharge_b signal increases when the magnitude of voltage Vcs decreases and decreases when the magnitude of voltage Vcs increases).

According to embodiments, the precharge_b pulse is designed so that precharge_b varies similar to the array path as Vdd and Vcs vary. No external timing control is needed. Since both the precharge_b pulse and the array path 20 (e.g., ary_data0 in array path 20) get faster or slower depending on the (magnitude) levels of Vdd and Vcs, this allows for a faster operating frequency and/or faster array performance (in the case where both precharge_b pulse and the array path 20 are faster) and/or a functional array (in the case where both paths are slower.)

Figure 4:
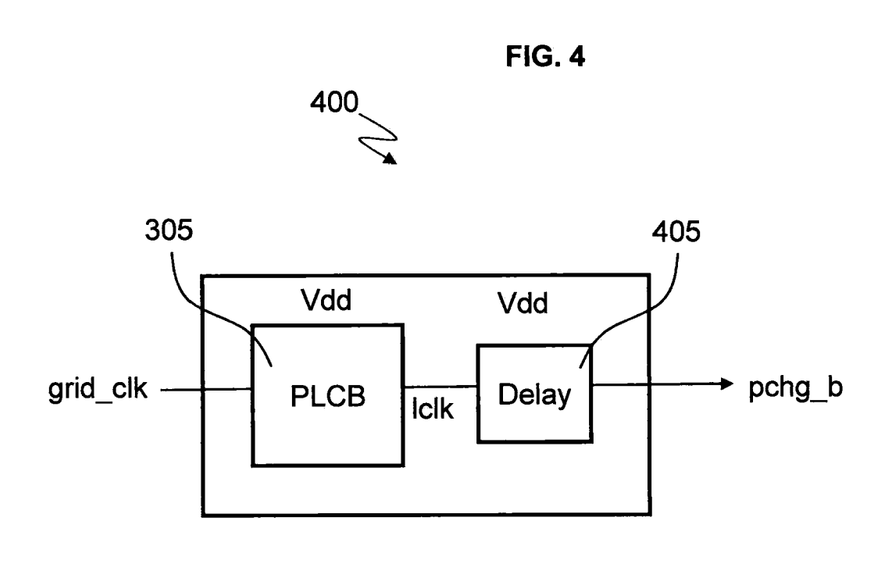
FIG. 4 is a block diagram illustrating a state of the art system for creating the precharge pulse (pchg_b) with only pulse and delay from Vdd.

FIG. 4 is a block diagram 400 illustrating a state-of-the-art system for creating the pchg_b with only pulse width and delay powered from Vdd (unlike embodiments). FIG. 4 illustrates global precharge generation (pchg_b). The state-of-the-art system is entirely based on the Vdd supply so the delay and pulse width are both sensitive to (dependent upon) only the Vdd supply level. The PLCB 305 in FIG. 4 generates both the pulse and delay for the lclk signal according to the Vdd supply. The lclk signal is output to a delay 405. The delay 405 adds delay according to the Vdd supply and outputs the pchg_b pulse and delay according to the magnitude of the Vdd supply.

Figure 5:
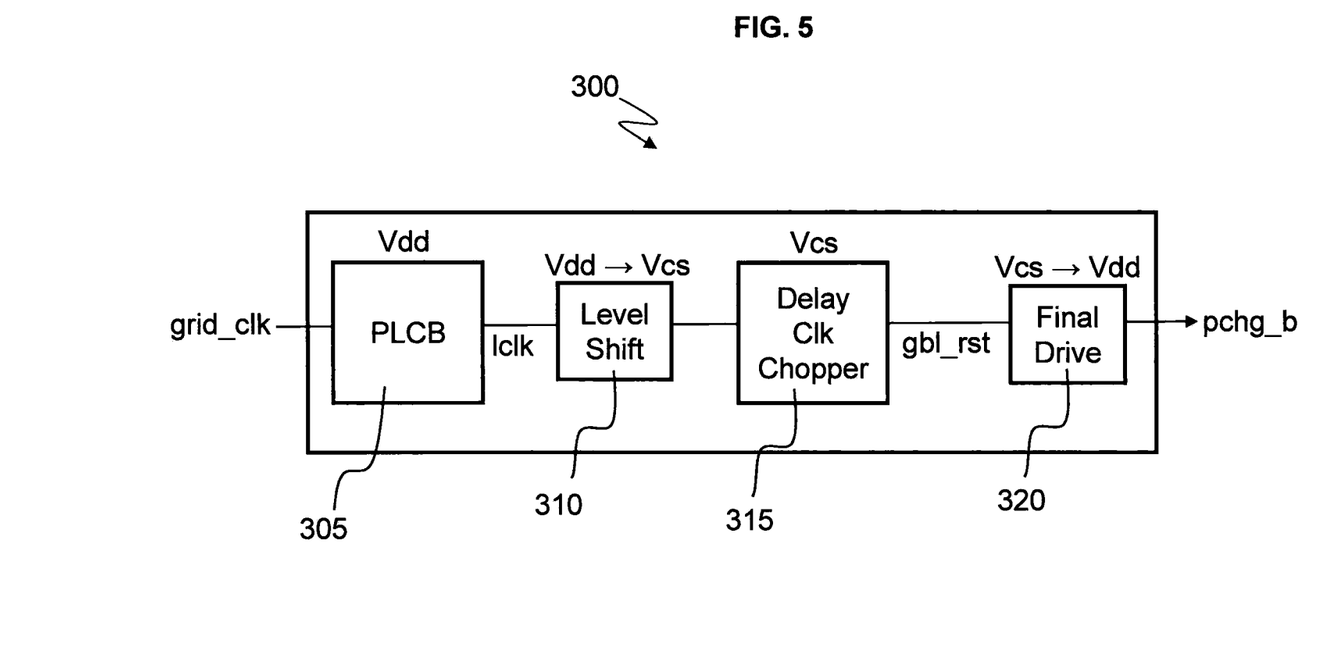
FIG. 5 is a block diagram of the precharge pulse (pchg_b) generation circuit according to an embodiment.

As compared to the state-of-the-art system, FIG. 5 is a block diagram of the precharge pulse (pchg_b) generation circuit 300 according to an embodiment. The PLCB 305 receives the grid_clk signal and receives the Vdd power supply. The PLCB 305 generates the local clock (lclk) delay and pulse width which changes with variations of (only) the Vdd voltage level. The PLCB 305 outputs the lclk signal to the level shifter 310. The PLCB 305 (programmable local clock buffer) is the interface between the grid clock and the array macro (or logic) local clock. The level shifter 310 increases voltage from Vdd level to the Vcs level. The delay clock chopper circuit 315 receives power from the Vcs power supply, which ensures that the pulse width and delay are sensitive to (i.e., matches and/or incorporates pulse width and delay based on) the Vcs power supply level. The delay clock chopper circuit 315 outputs (to the final drive circuit 320) the global reset (gbl_rst) pulse based on the Vcs voltage level. The final drive 320 converts the voltage signal from the Vcs level to the Vdd level. The final drive 320 outputs the precharge_b pulse (pchg_b). The precharge_b pulse width is designed at a given Vcs and Vdd voltage level (nominal specification.) The precharge_b pulse width is designed to reliably reset the global bitline 10 and to end before the array evaluate signal rises (e.g., before ary_data0 rises). This is a precharge before evaluate design. By including Vcs level elements in the design of the precharge_b pulse, tracking of the precharge_b pulse with the array evaluate (ary_data0) is maintained as Vcs and Vdd vary.

The final drive 320 shifts the precharge_b pulse (pchg_b) to the Vdd level to drive the global bitline 10 reset PFET T1 device. As can be seen in the circuit 300, the circuit 300 introduces delay and pulse width Vcs sensitivity to the pchg_b pulse and contains similar (matching) Vdd sensitivity as the array path 20. Therefore, both the pchg_b path (shown in circuit 300) and array evaluate path 20 have similar variations (track) with the variations in both the Vcs and Vdd supplies.

Figure 6:
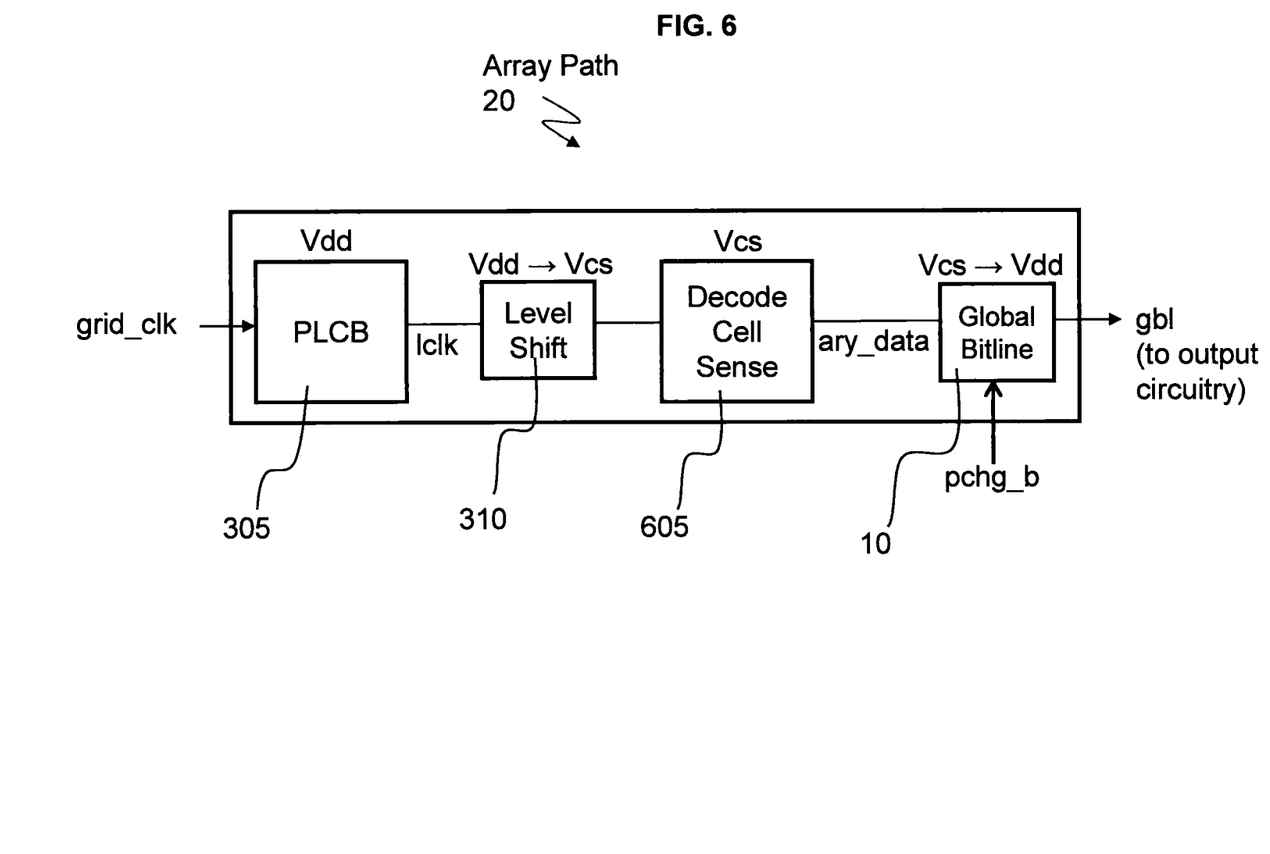
FIG. 6 is a block diagram of an array path according to an embodiment.

FIG. 6 is a block diagram example of the array path 20 according to an embodiment. The array path 20 is configured to output the array_data for array_data 0 (ary_data 0) through array data N (ary_data N), that respectively provide gate voltage to transistors T5 through T_N. The array path 20 includes PLCB 305 which outputs lclk to the level shifter 310. The level shifter 310 converts the voltage signal up from Vdd to Vcs. Decode cells sense circuitry 605 contains the entry decode, the memory cells of the SRAM, and any sense circuitry which generates the gate voltage signal of the ary_data (for any one of the ary_data 0 through ary_data N signals). For example, the ary_data 0 signal is output by the decode cells sense circuitry 605 to the transistor T5 connected to the global bitline (gbl) 10. When output, the ary_data 0 turns on the transistor T5, which pulls the global bitline 10 down to ground (approximately 0 volts). The global bitline 10 also receives pchg_b at a different timing from the ary_data 0 according to embodiments.

For proper operation, the timing between pchg_b and ary_data 0 is such that the pchg_b signal/voltage rises before ary_data 0 signal/voltage rises (the ary_data 0 rises later). Also, the ary_data 0 signal/voltage falls before the pchg_b signal/voltage falls. As noted above, when the pchg_b rises (i.e., is high), the (PFET) transistor T1 turns off; when the pchg_b falls (i.e., is low), the (PFET) transistor T1 turns on and the global bit line 10 is pulled up to Vdd. When the ary_data 0 rises (i.e., is high), the (NFET) transistor T5 is turned on, and the global bitline 10 is pulled down to ground; when the ary_data 0 falls (i.e., is low), the (NFET) transistor T5 is turned off. Accordingly, the transistors T1 and T5 are designed to be turned on and off at different times.

Figure 7:
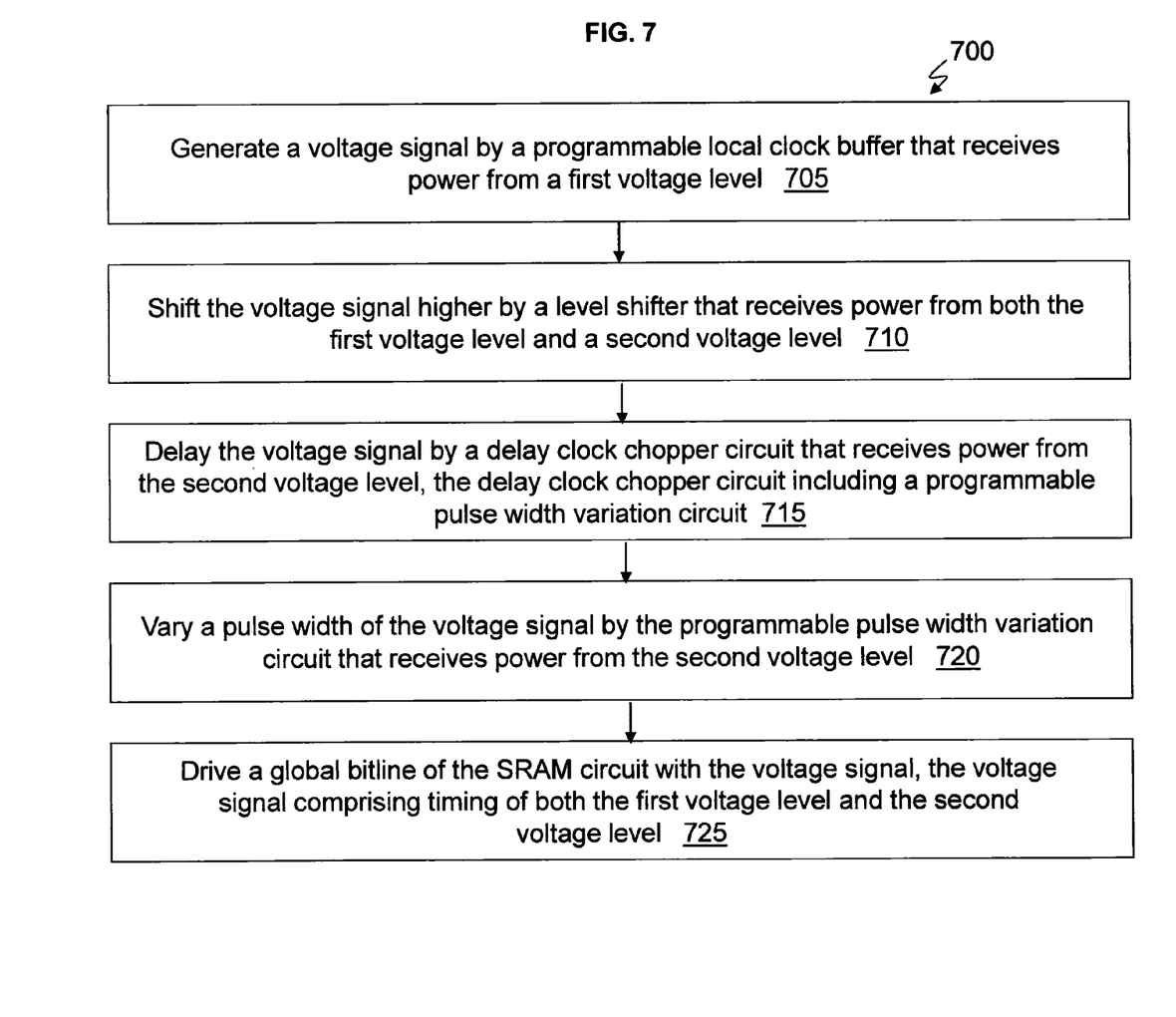
FIG. 7 is a method of generating timing control via the precharge pulse generation circuit for an SRAM circuit operating with dual power supplies according to an embodiment.

Now turning to FIG. 7, a method 700 illustrates generating timing control via circuit 300 for an SRAM circuit operating with dual power supplies according to an embodiment.

The programmable local clock buffer 305 generates a voltage signal (e.g., lclk) and receives power from a first voltage level (e.g., Vdd supply voltage) at block 705. The PLCB 305 outputs to the level shifter 310.

The level shifter 310 shifts the voltage signal higher and receives power from both the first voltage level (Vdd supply voltage) and a second voltage level (e.g., Vcs supply voltage) at block 710. The level shifter 310 outputs to the delay clock chopper circuit 315.

At block 715, the delay clock chopper circuit 315 delays the voltage signal and receives power from the second voltage level (Vcs supply voltage), and the delay clock chopper circuit 315 includes the programmable pulse width variation circuit 325.

The programmable pulse width variation circuit 325 varies a pulse width of the voltage signal and receives power from the second voltage level at block 720. The PWVAR circuit 325 outputs to the final drive circuit 320.

At block 725, the final drive 320 drives the global bitline 10 of the SRAM circuit with the voltage signal, in which the voltage signal (pchg_b) has timing that is sensitive to (dependent upon) both the first voltage level (Vdd) and the second voltage level (Vcs). The timing is the time between one pulse and the next pulse (which can also be measured from/between the leading edges of the pulses). The pulse width is how wide (or long) the pulse is. The pulse width of the voltage signal (pchg_b) varies only as the second voltage (Vcs) level varies. There is no pulse width sensitivity (of pchg_b) to the first voltage level. The delay clock chopper circuit 315 adds customized delay time to the voltage signal (pchg_b) based on the Vcs voltage. The delay clock chopper circuit 315 generates the pulse width for the pchg_b signal using circuits powered by the second voltage level (Vcs voltage).

The customized delay time and pulse width are designed to match the sensitivity of the (evaluate) time for electrical current to travel the array path 20 in the SRAM circuit, which contains circuitry powered by the Vcs voltage. The customized (evaluate) delay time (i.e., the customized delay time added by delay clock chopper 315) varies with (e.g., includes a pattern of) the timing in the decode cell sense circuitry 605 (in the array path 20) in the SRAM circuit.

The voltage signal is the precharge signal (i.e., pchg_b). The precharge signal is a gate voltage for the power transistor T1 connected to the global bitline 10. An array data signal (such as, ary_data 0) is the gate voltage for a data path transistor (e.g., transistor T5) connected to the array path 20. The data path transistor T5 is connected to the global bit line 10. The array path 20 includes the decode cell sense circuitry 605 powered by the second voltage level (Vcs voltage), such that the array data signal (ary_data 0) has timing that is sensitive to (dependent upon) the second voltage level (Vcs voltage).

The precharge signal (pchg_b) rises before the array data signal (ary_data 0), and the precharge signal falls after the array data signal falls. The power transistor T1 is turned on when the precharge signal falls, and the power transistor T1 is turned off when the precharge signal rises. The data path transistor T5 is turned on when the array data signal (ary_data 0) rises, and the data path transistor T5 is turned off when the array data signal falls.

When turned on, the power transistor T1 powers the global bitline 10 to the first voltage level (Vdd supply voltage). When turned on, the data path transistor T5 pulls the global bitline 10 to approximately ground (approximately 0). The precharge signal and the array data signal are respectively configured to turn on the power transistor T1 and the data path transistor T5 at different times, such that the power transistor is off when the data path transistor is on and such that the data path transistor is off when the power transistor is on.

Figure 9:
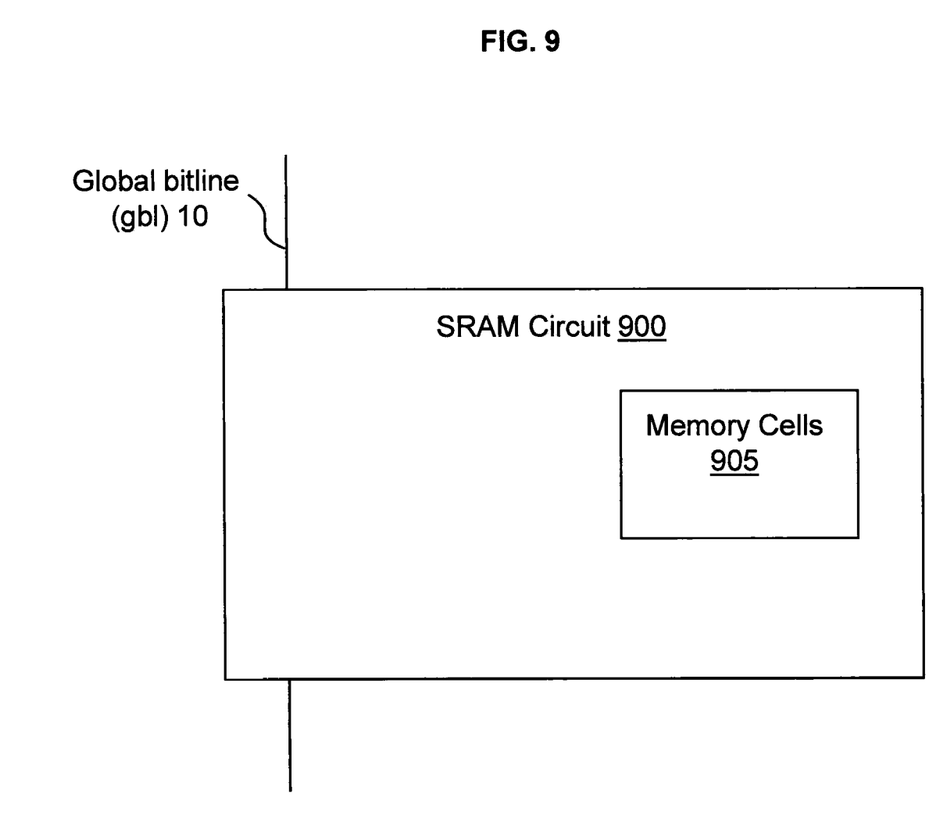
FIG. 9 is a block diagram of an SRAM circuit according to an embodiment.

FIG. 9 is a block diagram of an SRAM circuit 900 according to an embodiment. The SRAM circuit 900 includes and/or is connected to the circuits 20, 100, 300. The SRAM circuit 900 includes memory cells 905 that hold bits as understood by one skilled in the art.

Figure 8:
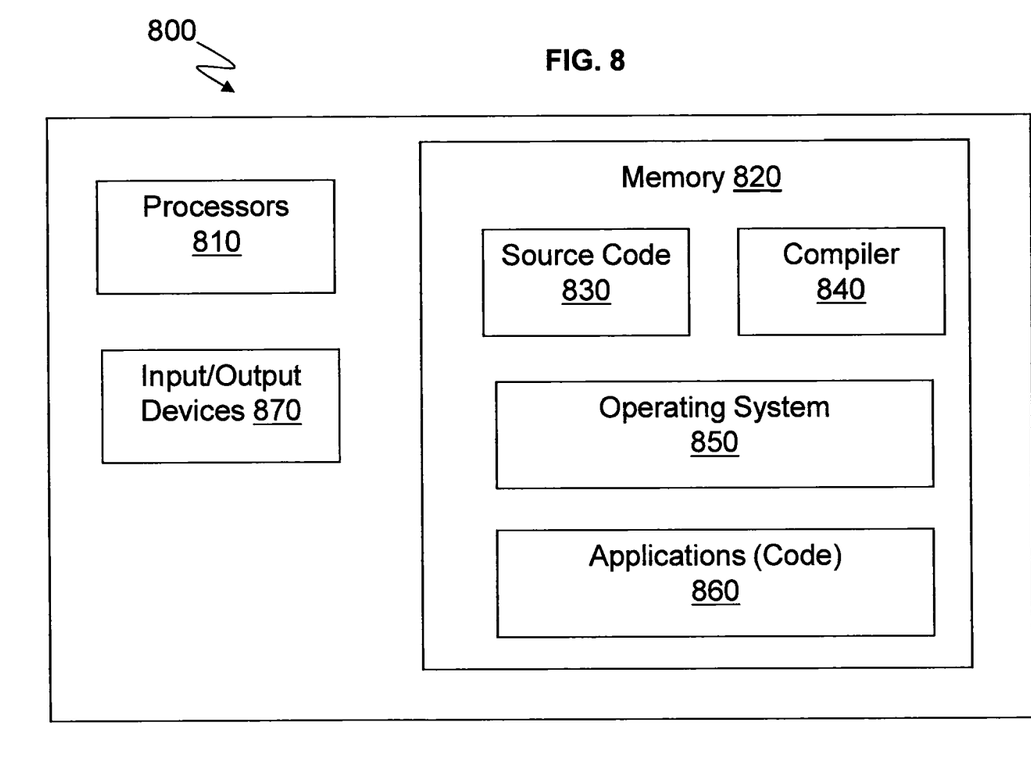
FIG. 8 illustrates an example computer that implements and executes the features discussed herein.

FIG. 8 illustrates an example computer 800 (e.g., which includes the various circuits for the SRAM circuit as discussed herein) that can implement features discussed herein. The computer 800 may be a distributed computer system over more than one computer. Various methods, procedures, modules, flow diagrams, tools, applications, circuits, elements, and techniques discussed herein may also incorporate and/or utilize the capabilities of the computer 800. Indeed, capabilities of the computer 800 may be utilized to implement and execute features of exemplary embodiments discussed herein.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a macroprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Note that the memory 820 can have a distributed architecture, where various components are situated remote from one another, but can be accessed by the processor(s) 810.

The software in the computer readable memory 820 may include one or more separate programs, each of which comprises an ordered listing of executable instructions for implementing logical functions. The software in the memory 820 includes a suitable operating system (O/S) 850, compiler 840, source code 830, and one or more applications 860 of the exemplary embodiments. As illustrated, the application 860 comprises numerous functional components for implementing the features, processes, methods, functions, and operations of the exemplary embodiments.

The operating system 850 may control the execution of other computer programs, and provides scheduling, input-output control, file and data management, memory management, and communication control and related services.

The software application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

The I/O devices 870 may include input devices (or peripherals) such as, for example but not limited to, a mouse, keyboard, scanner, microphone, camera, etc. Furthermore, the I/O devices 850 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method to generate timing control for an SRAM circuit operating with dual power supplies, the method comprising:
   generating a voltage signal by a programmable local clock buffer that receives power from a first voltage level;
   shifting the voltage signal higher by a level shifter that receives power from both the first voltage level and a second voltage level;
   delaying the voltage signal by a delay clock chopper circuit that receives power from the second voltage level, the delay clock chopper circuit including a programmable pulse width variation circuit;
   varying a pulse width of the voltage signal by the programmable pulse width variation circuit that receives power from the second voltage level; and
   driving a global bitline of the SRAM circuit with the voltage signal, the voltage signal having timing sensitive to both the first voltage level and the second voltage level and the pulse width sensitive to the second voltage level.

2. The method of claim 1, wherein the delay clock chopper circuit adds customized delay time to the voltage signal.

3. The method of claim 2, wherein the delay clock chopper circuit generates the pulse width for the voltage signal such that the pulse width depends on a magnitude of the second voltage level.

4. The method of claim 2, wherein the customized delay time tracks with an amount of time to travel an array path in the SRAM circuit.

5. The method of claim 4, wherein the customized delay time varies with a timing of decode cell sense circuitry in the SRAM circuit.

6. The method of claim 1, wherein the voltage signal is a precharge signal.

7. The method of claim 6, wherein the precharge signal is a gate voltage for a power transistor connected to the global bitline.

8. The method of claim 7, wherein an array data signal is a gate voltage for a data path transistor connected to the array path;
   wherein the data path transistor is connected to the global bit line; and
   wherein the array path includes decode cell sense circuitry powered by the second voltage level, such that the array data signal includes timing sensitive to the second voltage level.

9. The method of claim 7, wherein the precharge signal rises before the array data signal; and
   wherein the precharge signal falls after the array data signal falls.

10. The method of claim 9, wherein the power transistor is turned on when the precharge signal falls, and the power transistor is turned off when the precharge signal rises;
    wherein the data path transistor is turned on when the array data signal rises, and the data path transistor is turned off when the array data signal falls.

11. The method of claim 10, wherein when turned on, the power transistor powers the global bitline to the first voltage level.

12. The method of claim 11, wherein when turned on, the data path transistor pulls the global bitline to approximately ground.

13. The method of claim 12, wherein the precharge signal and the array data signal are respectively configured to turn on the power transistor and the data path transistor at different times, such that the power transistor is off when the data path transistor is on and such that the data path transistor is off when the power transistor is on.

14. A precharge generation circuit to generate timing control for an SRAM circuit operating with dual power supplies, the circuit comprising:
   a programmable local clock buffer configured to generate a voltage signal and to receive power from a first voltage level;
   a level shifter connected to the programmable local clock buffer, the level shifter configured to shift the voltage signal higher and to receive power from both the first voltage level and a second voltage level;
   a delay clock chopper circuit connected to the level shifter, the delay clock chopper circuit configured to delay the voltage signal and to receive power from the second voltage level, the delay clock chopper circuit including a programmable pulse width variation circuit; and
   the programmable pulse width variation circuit configured to vary a pulse width of the voltage signal and to receive power from the second voltage level;
   wherein a global bitline of the SRAM circuit is driven with the voltage signal, the voltage signal having timing sensitive to both the first voltage level and the second voltage level and the pulse width sensitive to the second voltage level.

15. The circuit of claim 14, wherein the delay clock chopper circuit adds customized delay time to the voltage signal.

16. The circuit of claim 15, wherein the delay clock chopper circuit generates the pulse width for the voltage signal such that the pulse width depends on a magnitude of the second voltage level.

17. The circuit of claim 15, wherein the customized delay time tracks with an amount of time to travel an array path in the SRAM circuit.

18. The circuit of claim 17, wherein the customized delay time varies with a timing of decode cell sense circuitry in the SRAM circuit.

19. The circuit of claim 14, wherein the voltage signal is a precharge signal.

20. The circuit of claim 19, wherein the precharge signal is a gate voltage for a power transistor connected to the global bitline.

* * * * *